(12) United States Patent
Miyake et al.

(10) Patent No.: US 8,058,654 B2
(45) Date of Patent: Nov. 15, 2011

(54) DISPLAY DEVICE AND MANUFACTURING METHOD THEREOF

(75) Inventors: Hidekazu Miyake, Mobara (JP); Eiji Oue, Mobara (JP); Takuo Kaitoh, Mobara (JP); Toshio Miyazawa, Chiba (JP)

(73) Assignee: Hitachi Displays, Ltd., Chiba (JP)

( * ) Notice: Subject to any disclaimer, the term of this patent is extended or adjusted under 35 U.S.C. 154(b) by 126 days.

(21) Appl. No.: 12/379,662

(22) Filed: Feb. 26, 2009

(65) Prior Publication Data

US 2009/0218575 A1 Sep. 3, 2009

(30) Foreign Application Priority Data

Feb. 29, 2008 (JP) ................................. 2008-049885

(51) Int. Cl.
*H01L 27/14* (2006.01)
*H01L 29/04* (2006.01)
*H01L 29/15* (2006.01)
*H01L 31/036* (2006.01)

(52) U.S. Cl. ................. 257/72; 257/58; 257/70; 257/57
(58) Field of Classification Search .................... 257/49, 257/57, 59, 64–66, 70, 72, 607, 627, 628
See application file for complete search history.

(56) References Cited

U.S. PATENT DOCUMENTS

| | | | |
|---|---|---|---|
| 4,746,628 A | 5/1988 | Takafuji et al. | |
| 6,087,205 A | 7/2000 | Yamamori | |
| 6,620,719 B1 * | 9/2003 | Andry et al. | 438/597 |
| 2004/0033648 A1 | 2/2004 | Matsunaga et al. | |
| 2004/0135143 A1 | 7/2004 | Harano et al. | |
| 2006/0008932 A1 | 1/2006 | Oh et al. | |
| 2007/0187674 A1 * | 8/2007 | Nakamura et al. | 257/40 |
| 2008/0099759 A1 * | 5/2008 | Fujii et al. | 257/40 |
| 2008/0303030 A1 * | 12/2008 | Sakai et al. | 257/72 |
| 2008/0308811 A1 * | 12/2008 | Miyake et al. | 257/72 |

FOREIGN PATENT DOCUMENTS

| | | |
|---|---|---|
| CN | 1487569 A | 4/2004 |
| CN | 1517752 A | 8/2004 |
| CN | 1680992 A | 10/2005 |
| DE | 3431-155 A1 | 3/1985 |
| EP | 0-217-406 A2 | 4/1987 |

(Continued)

OTHER PUBLICATIONS

Terauchi et al. "Manufacture of Thin-Film Transistor", Jun. 1, 1988, English Abstract only of JP63-001073.*

(Continued)

*Primary Examiner* — Zandra Smith
*Assistant Examiner* — Telly Green
(74) *Attorney, Agent, or Firm* — Stites & Harbison PLLC; Juan Carlos A. Marquez, Esq.

(57) ABSTRACT

Provided is a display device including a p-type thin film transistor formed on a substrate, in which the p-type thin film transistor includes: a gate electrode; a drain electrode; a source electrode; an insulating film; a semiconductor layer formed on a top surface of the gate electrode through the insulating film; and diffusion layers of p-type impurities formed at each of an interface between the drain electrode and the semiconductor layer and an interface between the source electrode and the semiconductor layer, the drain electrode and the source electrode being formed so as to be opposed to each other with a clearance formed therebetween on a top surface of the semiconductor layer.

8 Claims, 7 Drawing Sheets

FOREIGN PATENT DOCUMENTS

| | | |
|---|---|---|
| EP | 0-603-622 A1 | 6/1994 |
| GB | 2-044-994 A | 10/1980 |
| JP | 05-063196 | 9/1991 |
| KR | 2004-0061541 | 7/2004 |

OTHER PUBLICATIONS

Office Action from Chinese Patent Office on Application 200910005799.2 dated Apr. 13, 2010.

Kasama, et al., "Improvement of PECVD-SiN$_x$ for TFT Gate Insulator by Controlling Ion Bombardment Energy", Mar. 1996, pp. 398-406, IEICE Trans. Electron., vol. E79-C, No. 3.

Office Action of Korean Patent Office for corresponding Korean Patent Application No. 9-5-2010-048485084, dated Oct. 27, 2010.

Partial European Search Report of European Patent Office for corresponding European Patent Application No. EP-09-15-3984, dated Nov. 26, 2010.

\* cited by examiner

DISPLAY DEVICE AND MANUFACTURING METHOD THEREOF

CROSS-REFERENCE TO RELATED APPLICATION

The present application claims priority from Japanese application JP 2008-049885 filed on Feb. 29, 2008, the content of which is hereby incorporated by reference into this application.

BACKGROUND OF THE INVENTION

1. Field of the Invention

The present invention relates to a display device and a manufacturing method thereof. More particularly, the present invention relates to a display device including a thin film transistor formed on a substrate thereof, and to a manufacturing method for the display device.

2. Description of the Related Art

In an active matrix type display device, a plurality of pixels are arranged in matrix. In addition, gate signal lines are provided so as to be common to the respective pixels arranged in a row direction, and the gate signal lines are selected in an order in which the gate signal lines are provided in a column direction, whereby scanning signals are supplied thereto. Further, at timing at which the gate signal line is selected, a video signal is supplied via a drain signal line common to the respective pixels arranged in the column direction.

For this reason, each pixel includes a thin film transistor provided for feeding the video signal supplied via the drain signal line to a pixel electrode provided on the pixel through the supply of the scanning signal.

Further, a drive circuit for supplying the gate signal line with the scanning signal and supplying the drain signal line with the video signal is provided on the same substrate on which the pixels are formed. The drive circuit is formed of a circuit including a plurality of thin film transistors.

As the thin film transistor included in the drive circuit, there is known a thin film transistor including an n-type thin film transistor and a p-type thin film transistor, in which semiconductor layers of the n-type thin film transistor and the p-type thin film transistor are made of a polycrystalline silicon (low temperature poly-Si) obtained by crystallizing an amorphous silicon. The thin film transistor in which the semiconductor layer is made of the above-mentioned polycrystalline silicon has high field effect mobility, and can drive the drive circuit at high speed.

For example, JP 05-63196 A discloses the thin film transistor as described above.

However, in the case where the n-type thin film transistor and the p-type thin film transistor are each formed of the semiconductor layer made of a polycrystalline silicon, it is necessary to form, between the semiconductor layer made of a polycrystalline silicon and a drain electrode and between the semiconductor layer made of a polycrystalline silicon and a source electrode, an amorphous silicon in which n-type impurities are doped in the case of the n-type thin film transistor, and an amorphous silicon in which p-type impurities are doped in the case of the p-type thin film transistor.

Therefore, the formation of the amorphous silicon in which n-type impurities are doped and the formation of the amorphous silicon in which p-type impurities are doped need to be performed in different mask processes, which leads to an increase in the number of manufacturing steps.

SUMMARY OF THE INVENTION

Therefore, it is an object of the present invention to provide a display device in which the number of manufacturing steps is reduced.

Further, it is another object of the present invention to provide a manufacturing method for a display device in which the number of manufacturing steps is reduced.

An outline of the representative aspects of the present invention disclosed in the subject application is described in brief as follows.

(1) In order to solve the above-mentioned problem, the present invention provides a display device including a p-type thin film transistor formed on a substrate, in which the p-type thin film transistor includes: a gate electrode; a drain electrode; a source electrode; an insulating film; a semiconductor layer formed on a top surface of the gate electrode through the insulating film; and diffusion layers of p-type impurities formed at each of an interface between the drain electrode and the semiconductor layer and an interface between the source electrode and the semiconductor layer, the drain electrode and the source electrode being formed so as to be opposed to each other with a clearance formed therebetween on a top surface of the semiconductor layer.

(2) In order to solve the above-mentioned problem, the present invention also provides a display device including a p-type thin film transistor and an n-type thin film transistor which are formed on a substrate, in which: the p-type thin film transistor and the n-type thin film transistor each include: a gate electrode; a drain electrode; a source electrode; an insulating film; and a semiconductor layer formed on a top surface of the gate electrode through the insulating film, the drain electrode and the source electrode being formed so as to be opposed to each other with a clearance formed therebetween on a top surface of the semiconductor layer; the p-type thin film transistor further includes, at each of an interface between the drain electrode and the semiconductor layer and an interface between the source electrode and the semiconductor layer, diffusion layers of p-type impurities; and the n-type thin film transistor further includes, at each of an interface between the drain electrode and the semiconductor layer and an interface between the source electrode and the semiconductor layer, semiconductor layers in which n-type impurities are doped.

(3) In the display device according to Item (2), wherein the n-type thin film transistor may further include, at each of the interface between the drain electrode and the semiconductor layer and the interface between the source electrode and the semiconductor layer, diffusion barrier layers for preventing a material of the drain electrode and the source electrode from diffusing into the semiconductor layer, and wherein the semiconductor layers in which n-type impurities are doped and the diffusion barrier layers are respectively accumulated as a sequentially-laminated body.

(4) In the display device according to Item (1), the drain electrode and the source electrode may be formed of, as a main material, any one material selected from the group consisting of aluminum, gallium, indium, and thallium, and the any one material may be diffused into the semiconductor layer to form the diffusion layer of p-type impurities.

(5) In the display device according to Item (1), the semiconductor layer may be formed of a polycrystalline semiconductor layer.

(6) In the display device according to Item (1), the semiconductor layer may be formed of a sequentially-laminated body of a polycrystalline semiconductor layer and an amorphous semiconductor layer.

(7) In order to solve the above-mentioned problem, the present invention further provides a manufacturing method for a display device including a p-type thin film transistor formed on a substrate, the p-type thin film transistor including: a gate electrode; a drain electrode; a source electrode; an insulating film; and a semiconductor layer formed on a top surface of the gate electrode through the insulating film, the drain electrode and the source electrode being formed so as to be opposed to each other with a clearance formed on a top surface of the semiconductor layer, the manufacturing method including: forming the drain electrode and the source electrode of any one material selected from the group consisting of aluminum, gallium, indium, and thallium as a main material; and forming, at each of an interface between the drain electrode and the semiconductor layer and an interface between the source electrode and the semiconductor layer, diffusion layers of p-type impurities through annealing.

It should be noted that the present invention is not limited to the structures as described above, and various modifications may be made without departing from the technical idea of the present invention.

The display device structured as described above may reduce the number of manufacturing steps.

The manufacturing method for a display device, which is structured as described above, may reduce the number of manufacturing steps.

BRIEF DESCRIPTION OF THE DRAWINGS

In the accompanying drawings:

FIGS. 4(a) to 4(e) is a series of process drawings illustrating an example of a manufacturing method for the n-type thin film transistor and the p-type thin film transistor which are illustrated in FIG. 2;

FIGS. 6(a) to 6(e) is a series of process drawings illustrating an example of a manufacturing method for the n-type thin film transistor and the p-type thin film transistor which are illustrated in FIG. 5;

FIGS. 7(a) to 7(f) is a series of process drawings illustrating a manufacturing method for a display device according to a third embodiment of the present invention.

DETAILED DESCRIPTION OF THE INVENTION

Hereinafter, with reference to the drawings, a display device according to the present invention is described by way of embodiments.

First Embodiment (General Structure)

Figure 8A:
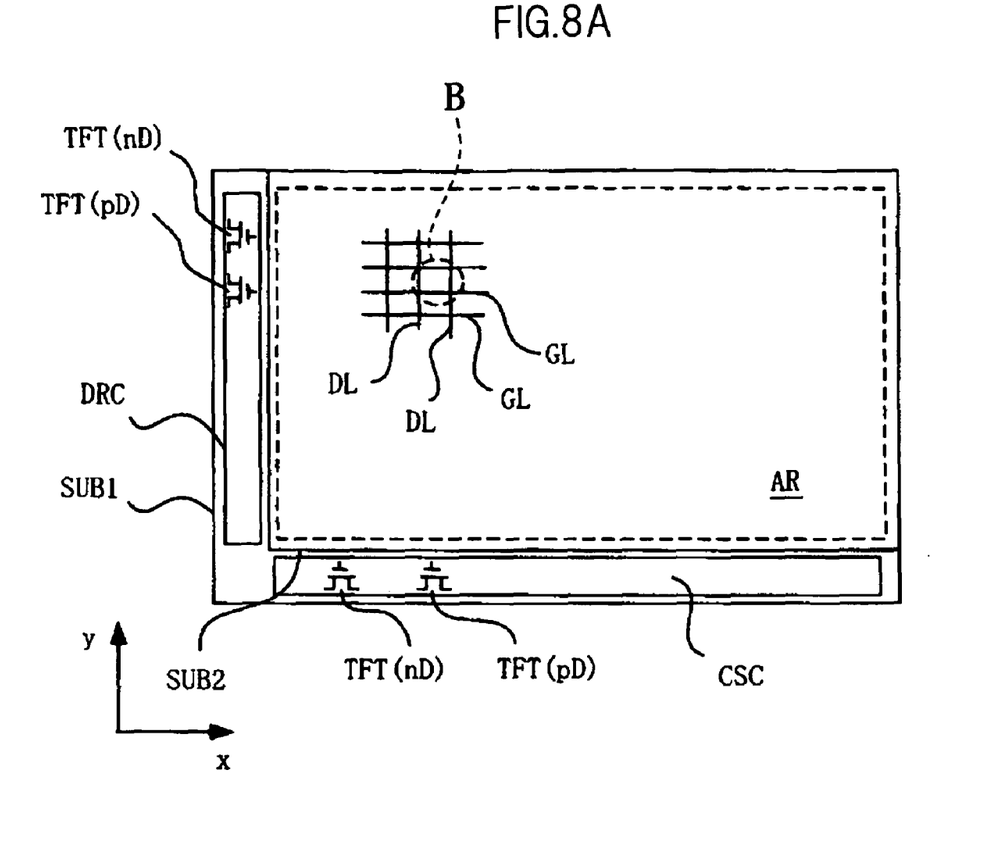
FIG. 8A is a schematic structural view illustrating a display device according to the first embodiment of the present invention.

FIG. 8A is a schematic structural view illustrating a display device according to an embodiment of the present invention. In FIG. 8A, a liquid crystal display device is taken as an example.

A substrate SUB1 and a substrate SUB2 are provided to face each other through liquid crystal sandwiched therebetween, and a liquid crystal display area AR is formed on a surface of the substrate SUB2 on a side opposite to a side of the substrate SUB2 on which the liquid crystal is held.

In the liquid crystal display area AR, a plurality of pixels arranged in matrix are formed on the side of the substrate SUB1 and the substrate SUB2 on which the liquid crystal is sandwiched therebetween.

Figure 8B:
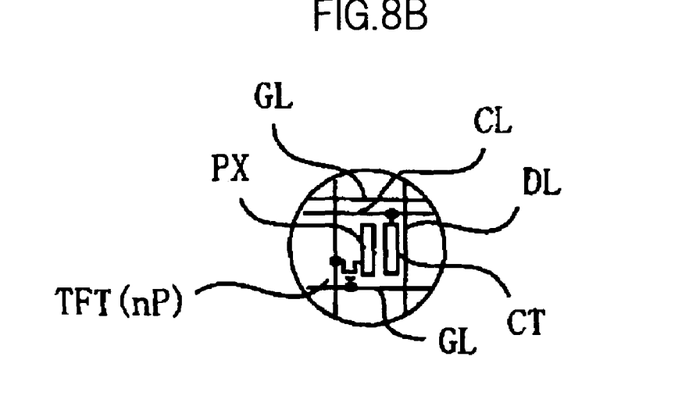
FIG. 8B is a magnified view illustrating an area circled by dotted frame B in the FIG. 8A.

FIG. 8B is a magnified view illustrating an area circled by dotted frame B in the FIG. 8A. As illustrated in FIG. 8B, those pixels arranged in matrix are each formed within an area surrounded by each of drain signal lines DL which are extended in a y direction and provided side by side in a x direction of FIG. 8A and each of gate signal lines GL which are extended in the x direction and provided side by side in the y direction of FIG. 8A.

Each pixel includes a thin film transistor TFT (referred to as TFT (nP) to distinguish from other thin film transistor TFT described later) which is turned on by a scanning signal (voltage) sent from the gate signal line GL, a pixel electrode PX to which a video signal (voltage) sent from the drain signal line DL is supplied via the turned-on thin film transistor TFT (nP), and a counter electrode CT which generates an electric field between the pixel electrode PX and itself.

It should be noted that the counter electrode CT is connected to a counter voltage signal line CL which is arranged in parallel with the gate signal line GL, and a signal (voltage) which becomes a reference with respect to the video signal is supplied thereto via the counter voltage signal line CL.

In a part in which the substrate SUB1 is exposed from the substrate SUB2 on an outside (left side in FIG. 8A) of the liquid crystal display area AR, there is formed a drive circuit DRC for sequentially supplying the gate signal lines GL with the scanning signals and supplying the drain signal lines DL with video signals at timing at which the scanning signal is supplied. The drive circuit DRC includes the n-type thin film transistor TFT (nD) and a p-type thin film transistor TFT (pD).

Further, in a part in which the substrate SUB1 is exposed from the substrate SUB2 on another outside (downside in FIG. 8A) of the liquid crystal display area AR, there is formed an RGB switching circuit CSC for switching and connecting the drain signal lines DL, which manage each of the three primary colors in a unit pixel of color display, for each color. The RGB switching circuit CSC includes the thin film transistor TFT (nD) and the thin film transistor TFT (pD) which correspond to those of the drive circuit DRC. The RGB switching circuit CSC has the substantially same structure as that of the drive circuit DRC, in which the thin film transistor TFT (nD) and the thin film transistor TFT (pD) thereof are formed in parallel with the formation of the thin film transistor TFT (nD) and the thin film transistor TFT (pD) of the drive circuit DRC. For this reason, the n-type thin film transistor and the p-type thin film transistor of the RGB switching circuit CSC are also denoted by reference symbols TFT (nD) and TFT (pD), respectively.

(P-Type Thin Film Transistor)

Figure 1A:
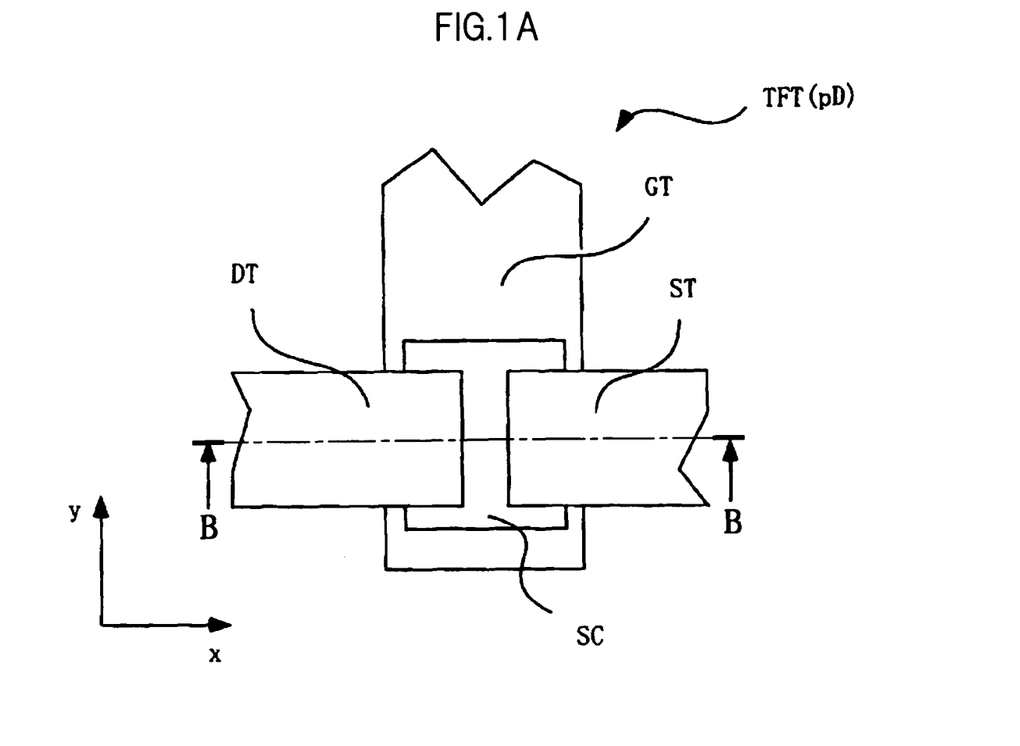
FIG. 1A is a plan view illustrating an example of a p-type thin film transistor formed on a substrate of a display device according to a first embodiment of the present invention.
Figure 1B:
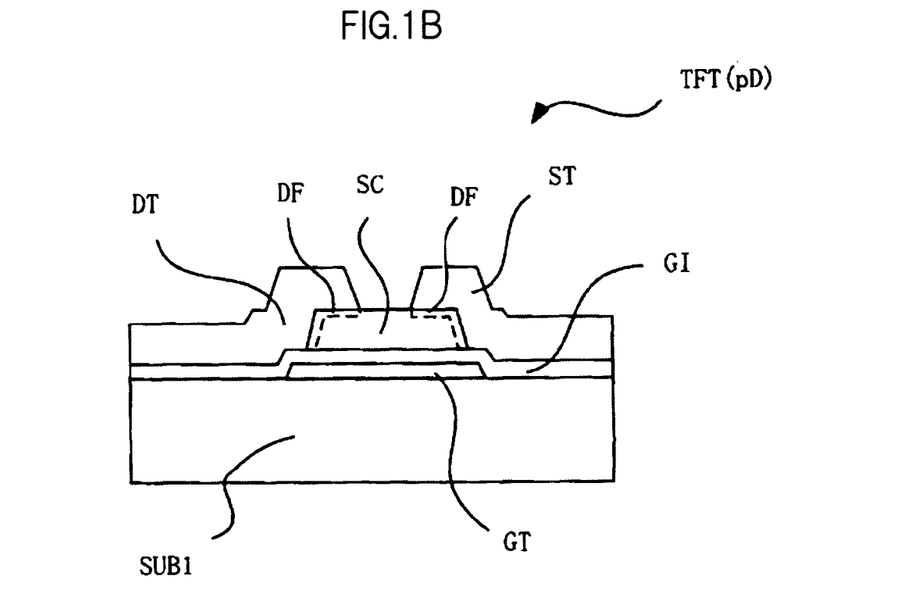
FIG. 1B is a cross-sectional view taken along a line B-B of FIG. 1A.

FIG. 1A is a plan view illustrating an example of the p-type thin film transistor TFT (pD). FIG. 1B is a cross-sectional view taken along a line B-B of FIG. 1A.

As illustrated in FIG. 1B, a gate electrode GT is formed on a surface of the substrate SUB1. The gate electrode GT is formed on the surface of the substrate SUB1 so as to be extended in the y direction of FIG. 1A, as illustrated in FIG. 1A.

In addition, an insulating film GI is formed on the surface of the substrate SUB1 so as to cover the gate electrode GT. The insulating film GI functions as a gate insulating film of the p-type thin film transistor TFT (pD) in a formation region of the p-type thin film transistor TFT (pD).

On a top surface of the insulating film GI, a semiconductor layer SC made of a polycrystalline silicon (p-Si) is formed in an island-like pattern so as to overlap the gate electrode GT. The semiconductor layer SC forms an i-type semiconductor layer in which impurities are not doped.

Further, a pair of electrodes DT and ST which are formed on a top surface of the semiconductor layer SC to face each other with a clearance being formed above the gate electrode GT. The electrodes DT and ST are formed to face each other while being spaced apart from each other. The electrodes DT and ST are formed on the insulating film GI and the electrodes DT and ST are extended in the x direction of FIG. 1A.

An area of the semiconductor layer SC, which is the clearance between the electrodes DT and ST, forms a channel region, and a distance between the electrodes DT and ST corresponds to a channel length of the p-type thin film transistor TFT (pD).

Those electrodes DT and ST are made of, for example, aluminum (Al). The electrodes DT and ST may be made of only aluminum, and may be made of aluminum as a main material and other metal. When annealing is performed at, for example, about 400° C. after the formation of the electrodes DT and ST, aluminum is diffused into the semiconductor layer SC, and a p(+)-type diffusion layer DF is formed at an interface between the electrode DT and the semiconductor layer SC and an interface between the electrode ST and the semiconductor layer SC.

The p-type thin film transistor TFT (pD) as described above forms a bottom-gate-type metal insulator semiconductor (MIS) transistor. Through application of a bias voltage, one of the electrodes DT and ST functions as a drain electrode, and the other thereof functions as a source electrode. For the sake of convenience, herein, an electrode located on the left side of FIGS. 1A and 1B and an electrode located on the right side thereof are referred to as the drain electrode DT and the source electrode ST, respectively.

In the p-type thin film transistor TFT (pD) structured as described above, there is no particular need to form a contact layer between the drain electrode DT and the semiconductor layer SC, and between the source electrode ST and the semiconductor layer SC. Accordingly, the p-type thin film transistor TFT (pD) may be formed with a simple process.

It should be noted that, in this embodiment, aluminum is used as a main material for the drain electrode DT and the source electrode ST of the p-type thin film transistor TFT (pD), but other material such as gallium (Ga), indium (In), or thallium (Tl) may be used as the main material therefor. Even when the material as described above is used, the p(+)-type diffusion layer DF may be formed at each of the interface between the drain electrode DT and the semiconductor layer SC, and the interface between the source electrode ST and the semiconductor layer SC.

(P-type Thin Film Transistor and N-type Thin Film Transistor)

Figure 2:
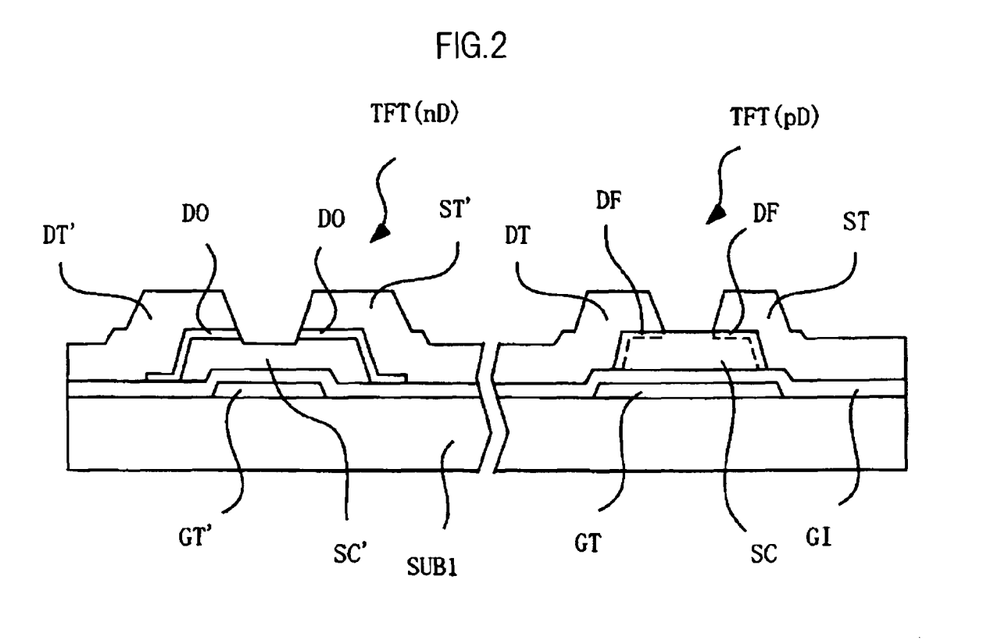
FIG. 2 is a cross-sectional view illustrating a structure of a complementary thin film transistor including the p-type thin film transistor and an n-type thin film transistor which are formed on the substrate of the display device according to the first embodiment of the present invention.

FIG. 2 is a cross-sectional view illustrating a structure of a complementary thin film transistor in which, along with the p-type thin film transistor TFT (pD), an n-type thin film transistor TFT (nD) is formed on the substrate of the display device according to this embodiment.

The p-type thin film transistor TFT (pD) illustrated in FIG. 2 has the structure similar to that of the p-type thin film transistor TFT (pD) illustrated in FIG. 1A. Thus, in the description below, a structure of the n-type thin film transistor TFT (nD) formed on a left side of FIG. 2 is described.

As illustrated on the left side in FIG. 2, a gate electrode GT' is formed on the top surface of the substrate SUB1. The gate electrode GT' is formed in the same layer and is made of the same material as the gate electrode GT of the p-type thin film transistor TFT (pD).

The insulating film GI is formed on the surface of the substrate SUB1 so as to cover the gate electrode GT'. The insulating film GI is formed so as to be extended from the p-type thin film transistor TFT (pD), and is formed as an extended portion of the insulating film GI of the formation region of the p-type thin film transistor TFT (pD).

On the top surface of the insulating film GI, a semiconductor layer SC' made of, for example, a polycrystalline silicon (p-Si) is formed in an island-like pattern so as to overlap the gate electrode GT'.

The semiconductor layer SC' is formed in the same layer and is made of the same material as the semiconductor layer SC of the p-type thin film transistor TFT (pD).

Further, a contact layer DO in which p(+)-type impurities are doped is formed on a surface of the semiconductor layer SC', that is, on a surface extending from a top surface to a side-wall surface of the semiconductor layer SC', and is further extended to a surface of the insulating film GI, on which the semiconductor layer SC' is not formed.

It should be noted that the contact layer DO is not formed in a part exposed from a drain electrode DT' and a source electrode ST', which are described later. The semiconductor layer SC' formed under the contact layer DO is exposed from a drain electrode DT' and a source electrode ST'.

Further, the drain electrode DT' and the source electrode ST' are formed above the top surface of the semiconductor layer SC' via the contact layer DO. As a result, two of the contact layer DO is formed at each of an interface between the drain electrode DT' and the semiconductor layer SC' and an interface between the source electrode ST' and the semiconductor layer SC'.

The drain electrode DT' and the source electrode ST' are formed in the same layer and are made of the same material as the drain electrode DT and the source electrode ST of the p-type thin film transistor TFT (pD).

As apparent from comparing with the n-type thin film transistor TFT (nD), in the p-type thin film transistor TFT (pD), a width of the gate electrode GT is larger than a width of the semiconductor layer SC and is formed beyond a formation region of the semiconductor layer SC. This is for increasing an on-current.

Figure 3A:
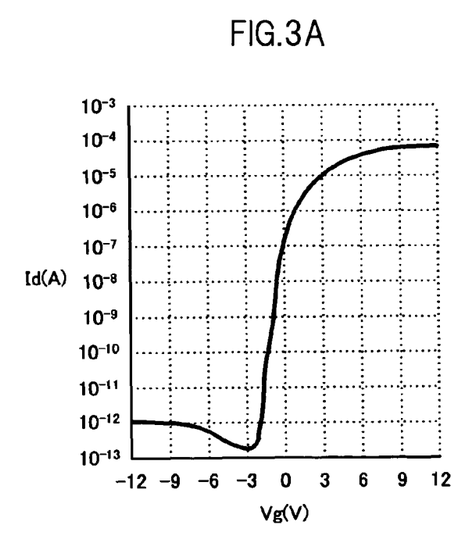
FIG. 3A is a graph illustrating Vg-Id characteristics of the n-type thin film transistor TFT (nD) of FIG. 2.
Figure 3B:
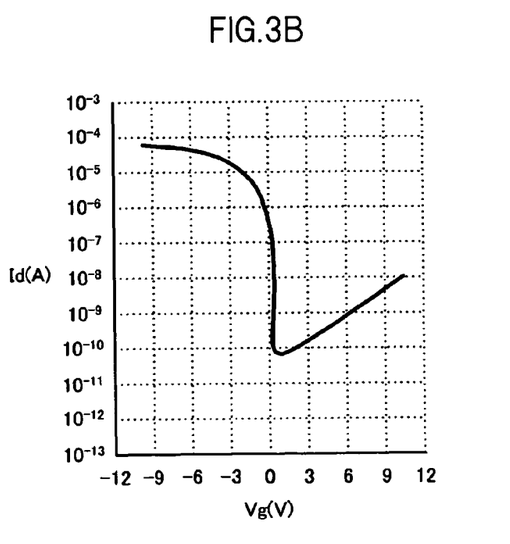
FIG. 3B is a graph illustrating Vg-Id characteristics of the p-type thin film transistor TFT (pD) of FIG. 2.

FIGS. 3A and 3B are graphs illustrating Vg-Id characteristics (characteristics of gate voltage and drain current) of the n-type thin film transistor TFT (nD) and the p-type thin film transistor TFT (pD), respectively. In FIGS. 3A and 3B, a horizontal axis and a vertical axis thereof represent a gate voltage Vg (V) and a drain current Id (A), respectively. FIGS.

3A and 3B show a relationship between the gate voltage and the drain current in the case where the drain voltage Vd is 5 V.

Accordingly, it may be found that the p-type thin film transistor TFT (pD) has sufficiently large current difference between when being turned on and when being turned off and can function as a switching element.

(Manufacturing Method)

FIGS. 4(a) to 4(e) is a series of process drawings illustrating an example of a manufacturing method for the n-type thin film transistor TFT (nD) and the p-type thin film transistor TFT (pD) illustrated in FIG. 2. Hereinafter, the manufacturing method is described process by process.

FIGS. 4(a) to 4(e) correspond to the description of FIG. 2, and manufacturing processes for the n-type thin film transistor TFT (nD) are illustrated on a left side of FIGS. 4(a) to 4(e), and manufacturing processes for the p-type thin film transistor TFT (pD) are illustrated on a right side thereof.

Hereinafter, the manufacturing method is described process by process.

Process 1. (FIG. 4(a))

Figure 4:
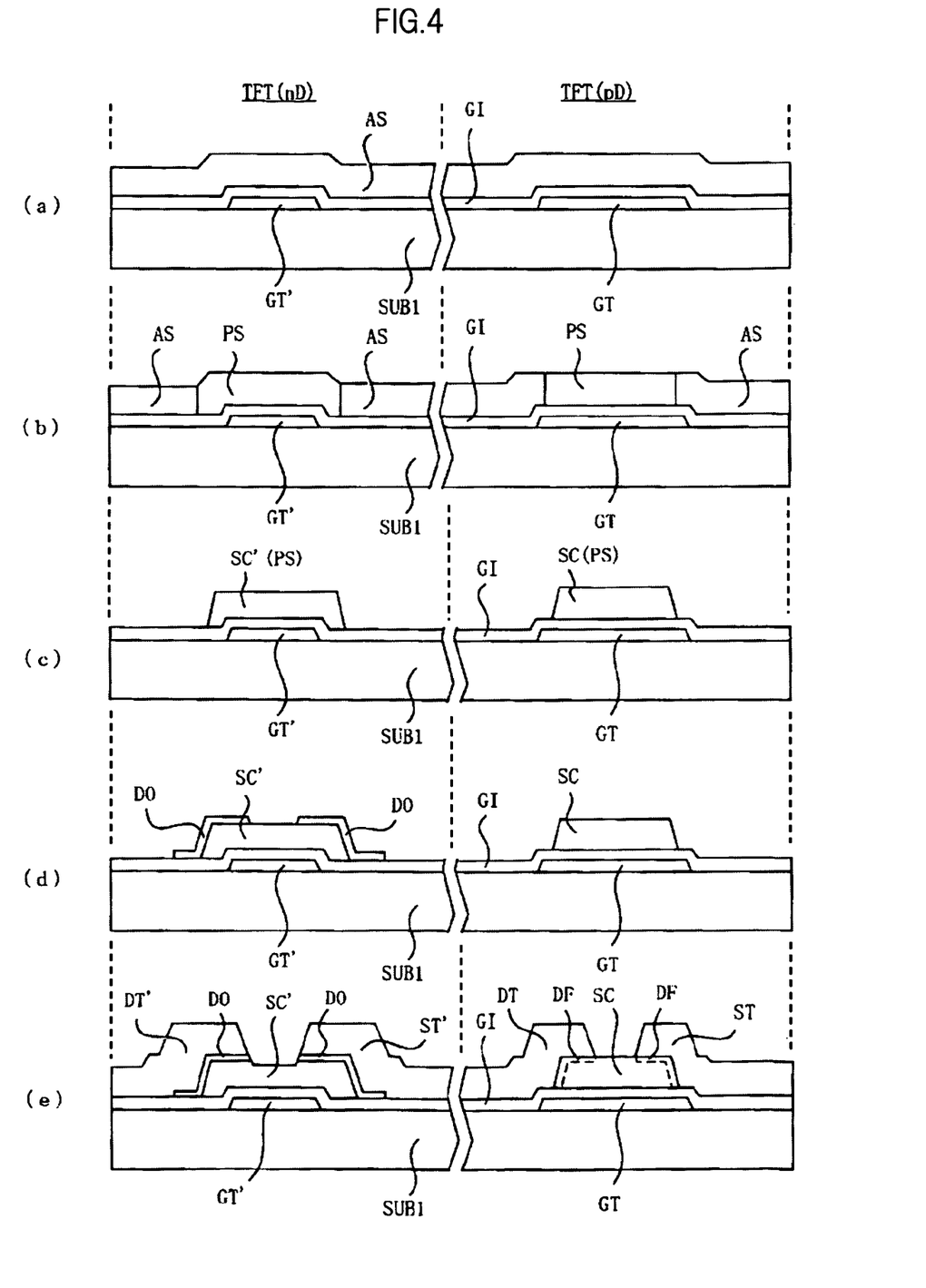

The gate electrode GT' and the gate electrode GT are formed on the surface of the substrate SUB1 made of glass, and further, the insulating film GI is formed so as to cover both the gate electrode GT' and the gate electrode GT.

Both the gate electrode GT' and the gate electrode GT are formed by forming a film (having a film thickness of 50 to 150 nm) made of refractory metal such as molybdenum (Mo) or an alloy thereof by employing sputtering, patterning the formed film by employing a photolithography technology, and then selectively etching the patterned film.

The insulating film GI is formed of SiO, SiN, or a laminated film thereof so as to have a film thickness of 100 to 300 nm.

Then, over the entire top surface of the insulating film GI, a semiconductor layer AS made of an amorphous silicon is formed to have a film thickness of 50 to 300 nm by employing, for example, chemical vapor deposition (CVD).

Process 2. (FIG. 4(b))

After performing dehydrogenation treatment on the semiconductor layer AS; the semiconductor layer AS is selectively irradiated with pulses or continuous-wave lasers to be crystallized in the formation region of the n-type thin film transistor TFT (nD) and the formation region of the p-type thin film transistor TFT (pD), whereby a semiconductor layer PS made of a polycrystalline silicon is formed. It should be noted that crystallization may be performed over the entire surface of the semiconductor layer AS.

Process 3. (FIG. 4(c))

The semiconductor layer AS is patterned by employing the photolithography technology, and then is selectively etched, with the result that the semiconductor layer PS made of a polycrystalline silicon is left in each of the formation region of the n-type thin film transistor TFT (nD) and the formation region of the p-type thin film transistor TFT (pD).

The semiconductor layer PS provided in the formation region of the n-type thin film transistor TFT (nD) and the semiconductor layer PS provided in the formation region of the p-type thin film transistor TFT (pD) correspond to the semiconductor layer SC' and the semiconductor layer SC illustrated in FIG. 2, respectively.

Process 4. (FIG. 4(d))

Over the entire surface of the substrate SUB1, a semiconductor layer (n(+)-type semiconductor layer) in which phosphorus (P) or the like is doped is formed to have a thickness of 10 to 50 nm by employing CVD.

Then, the n(+)-type semiconductor layer is patterned by employing the photolithography technology and then is etched to be left on the top surface of the semiconductor layer SC' of the n-type thin film transistor TFT (nD). Here, the left n(+)-type semiconductor layer is referred to as the contact layer DO. It should be noted that etching of the n(+)-type semiconductor layer for forming the contact layer DO is also performed in a part which becomes a channel region of the n-type thin film transistor TFT (nD).

Process 5. (FIG. 4(e))

A film made of aluminum (Al) is formed over the entire surface of the substrate SUB1 to have a film thickness of 300 to 500 nm by employing sputtering.

On this occasion, on upper and lower surfaces of the Al layer, a film made of refractory metal such as titanium (Ti) or molybdenum (Mo) is formed to have a film thickness of 30 to 100 nm. The refractory metal film thus formed is referred to as a so-called barrier metal layer, and is formed to reduce a contact resistance. It should be noted that the barrier metal layer does not have to be formed on the lower surface side of an electrode.

After that, the Al layer is patterned by employing the photolithography technology and is selectively etched, whereby the drain electrode DT' and the source electrode ST' are formed in the formation region of the n-type thin film transistor TFT (nD), and the drain electrode DT and the source electrode ST are formed in the formation region of the p-type thin film transistor TFT (pD) Further, the n-type thin film transistor TFT (nD) and the p-type thin film transistor TFT (pD) are covered with the SiN film or the like by employing CVD to form a protective film (not shown) over the entire surface of the substrate SUB1.

Then, annealing is performed for one to three hours at a temperature of 350 to 450° C. in $H_2$ or $N_2$ atmosphere. Through the annealing thus performed, aluminum (Al) contained in the drain electrode DT and the source electrode ST of the p-type thin film transistor TFT (pD) is diffused (in the case where the barrier metal layer is provided, is diffused through the barrier metal layer) into the semiconductor layer SC. As a result, the p(+)-type diffusion layer DF is formed at each of an interface between the drain electrode DT and the semiconductor layer SC and an interface between the source electrode ST and the semiconductor layer SC. It should be noted that the annealing may be performed prior to the formation of the protective film.

Second Embodiment

Figure 5:
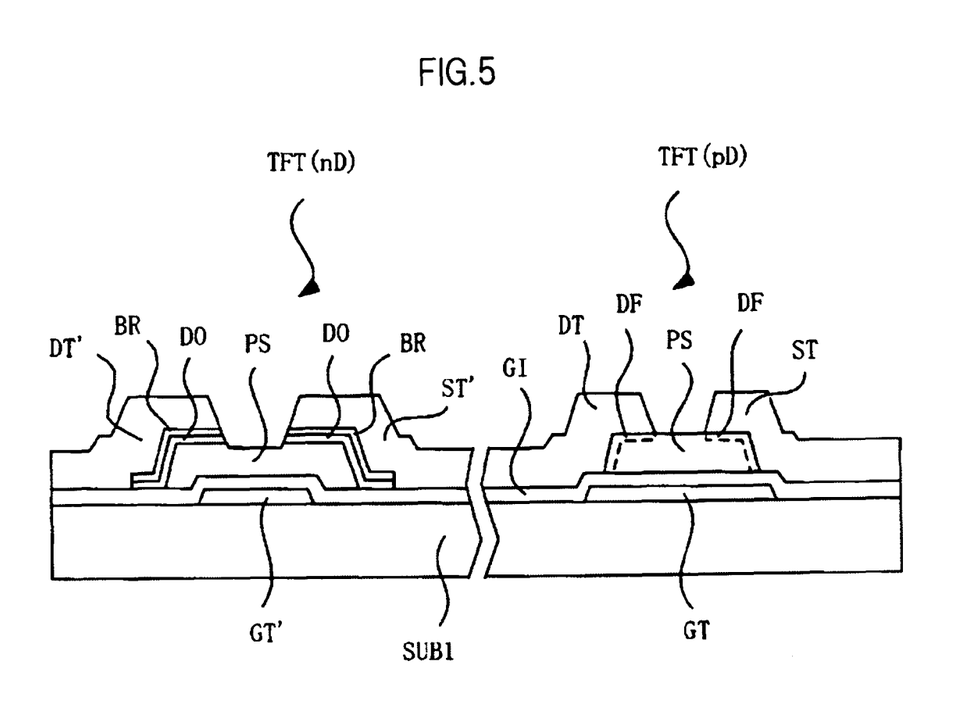
FIG. 5 is a structural view illustrating a p-type thin film transistor and an n-type thin film transistor which are formed on a substrate of a display device according to a second embodiment of the present invention.

FIG. 5 is a structural view illustrating a display device according to a second embodiment of the present invention, which corresponds to FIG. 2 of the first embodiment of the present invention. In FIG. 5, the same components as those of FIG. 2 are denoted by the same reference symbols and have the same materials and functions as those of FIG. 2.

FIG. 5 is different from FIG. 2 in that a diffusion barrier layer BR is formed at an interface between the drain electrode DT' and the contact layer DO in the n-type thin film transistor TFT (nD), and that the diffusion barrier layer BR is formed at an interface between the source electrode ST' and the contact layer DO.

The diffusion barrier layer BR is a layer for preventing aluminum (Al) forming the drain electrode DT' and the source electrode ST' from diffusing into the contact layer DO during annealing.

The diffusion barrier layer BR is made of, for example, Mo, Ti, or an alloy thereof, and is formed to have a film thickness to an extent that aluminum (Al) may be prevented from diffusing into the contact layer DO.

In such a case, an impurity concentration of the contact layer DO hardly changes and is easily set to a predetermined value.

FIGS. 6(a) to 6(e) is a series of process drawings illustrating an example of a manufacturing method for the n-type thin film transistor TFT (nD) and the p-type thin film transistor TFT (pD) illustrated in FIG. 5, in which descriptions thereof are given correspondingly to FIGS. 4(a) to 4(e) of the first embodiment of the present invention. In FIGS. 6(a) to 6(e), the same components as those of FIGS. 4(a) to 4(e) are denoted by the same reference symbols and have the same materials and functions as those of FIGS. 4(a) to 4(e).

Figure 6:
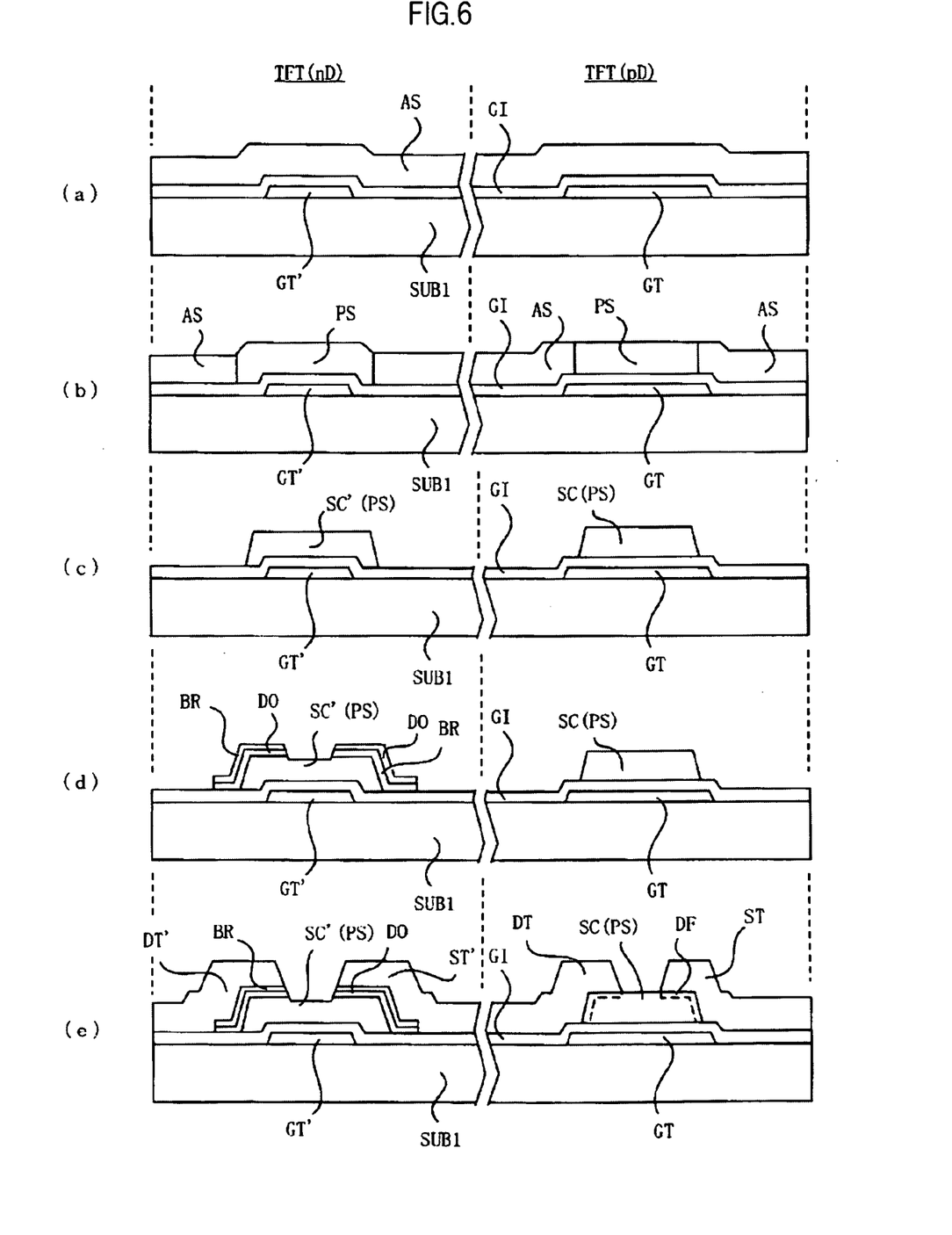

FIGS. 6(a) to 6(e) are different from FIGS. 4(a) to 4(e) in a process illustrated in FIG. 6(d).

That is, in FIG. 6(d), a semiconductor layer (n(+)-type semiconductor layer) in which phosphorus (P) or the like is doped and a metal layer made of molybdenum (Mo), titanium (Ti), or an alloy thereof are sequentially formed over the entire surface of the substrate SUB1 by employing CVD.

Then, the laminated body in which the n(+)-type semiconductor layer and the metal layer are sequentially formed is patterned collectively by employing the photolithography technology and then is etched. Through the etching thus performed, the n(+)-type semiconductor layer and the metal layer are left on the top surface of the semiconductor layer SC' of the n-type thin film transistor TFT (nD). The left n(+)-type semiconductor layer is used as the contact layer DO, and the left metal layer is used as the diffusion barrier layer BR. The laminated body formed of the n(+)-type semiconductor layer and the metal layer is also etched in a portion serving as the channel region of the n-type thin film transistor TFT (nD).

According to the manufacturing method as described above, the diffusion barrier layer BR may be formed without increasing the number of processes compared with the manufacturing method illustrated in FIGS. 4(a) to 4(e).

Third Embodiment

FIGS. 7(a) to 7(f) is a series of process drawings illustrating a manufacturing method for a display device according to a third embodiment of the present invention.

In a display device illustrated in FIGS. 7(a) to 7(f), a semiconductor layer of an n-type thin film transistor TFT (nP) used for pixel selection is made of an amorphous silicon. The process drawings of FIGS. 7(a) to 7(f) illustrate a case where the n-type thin film transistor TFT (nD) and the p-type thin film transistor TFT (pD) for a drive circuit are formed together with the n-type thin film transistor TFT (nP).

In FIGS. 7(a) to 7(f), the n-type thin film transistor TFT (nD), the p-type thin film transistor TFT (pD), and the n-type thin film transistor TFT (nP) are illustrated in the left, middle, and the right thereof, respectively. Hereinafter, a description is given process by process.

Process 1. (FIG. 7(a))

Figure 7:
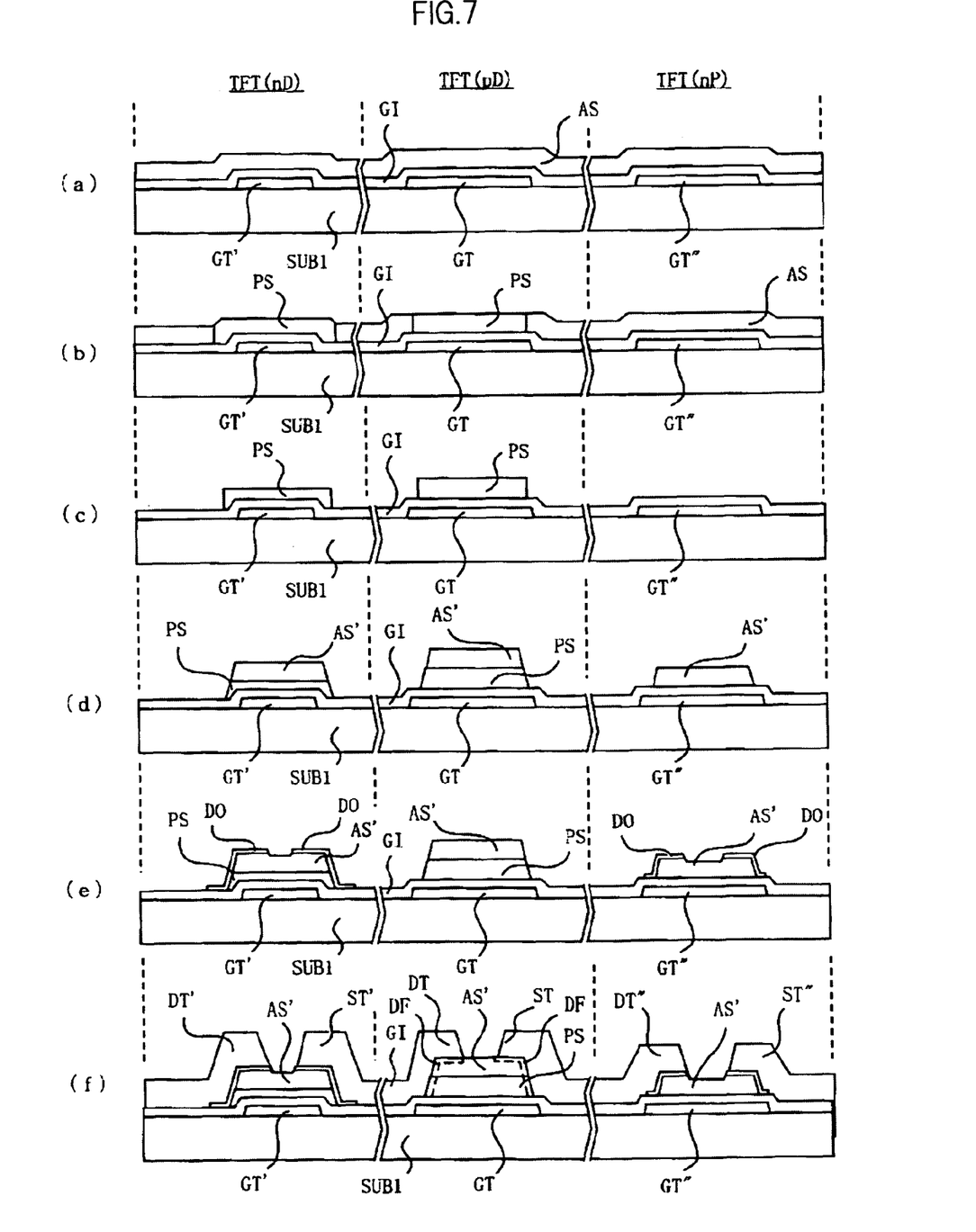

The gate electrode GT', the gate electrode GT, and a gate electrode GT" are formed on the surface of the substrate SUB1 made of glass, and the insulating film GI is formed so as to cover the gate electrode GT', the gate electrode GT, and the gate electrode GT".

The gate electrode GT', the gate electrode GT, and the gate electrode GT" are each formed by forming a film (having a film thickness of 50 to 150 nm) made of refractory metal such as molybdenum (Mo) or its alloy by employing sputtering, patterning the formed film by employing the photolithography technology, and selectively etching the patterned film.

For example, the insulating film GI is made of SiO or SiN, or is formed of a laminated film thereof. And the insulating film GI has a film thickness of 100 to 300 nm.

Then, the semiconductor layer AS made of an amorphous silicon is formed over the entire top surface of the insulating film GI by employing CVD to have a film thickness of 50 to 300 nm.

Process 2. (FIG. 7(b))

After performing dehydrogenation treatment on the semiconductor layer AS, the semiconductor layer AS is selectively irradiated with pulses or continuous-wave lasers, and the semiconductor layer AS located in the formation region of the n-type thin film transistor TFT (nD) and the formation region of the p-type thin film transistor TFT (pD) is crystallized, to thereby form the semiconductor layer PS made of a polycrystalline silicon. It should be noted that the semiconductor layer AS may be crystallized over the entire surface thereof.

Process 3. (FIG. 7(c))

The semiconductor layer AS is patterned by employing the photolithography technology, and is further selectively etched, with the result that the semiconductor layer PS made of a polycrystalline silicon is left in each of the formation region of the n-type thin film transistor TFT (nD) and the formation region of the p-type thin film transistor TFT (pD).

Process 4. (FIG. 7(d))

A semiconductor layer AS' made of an amorphous silicon is formed on the surface of the substrate SUB1 by employing, for example, CVD, to have a film thickness of 50 to 250 nm, is patterned by the photolithography technology, and is etched. As a result, the semiconductor layer AS' is left in the respective formation regions of the n-type thin film transistor TFT (nD), the p-type thin film transistor TFT (pD), and the n-type thin film transistor TFT (nP).

Accordingly, the semiconductor layer AS' is formed so as to be laminated on the semiconductor layer PS in the n-type thin film transistor TFT (nD) and the p-type thin film transistor TFT (pD). On the other hand, the semiconductor layer AS' is formed directly on the insulating film GI in the n-type thin film transistor TFT (nP).

In other words, in the n-type thin film transistor TFT (nD) and the p-type thin film transistor TFT (pD), the semiconductor layer is formed as the laminated body in which the semiconductor layer PS made of a polycrystalline silicon and the semiconductor layer AS' made of an amorphous silicon are sequentially laminated.

Process 5. (FIG. 7(e))

The semiconductor layer (n(+)-type semiconductor layer) in which phosphorus (P) or the like is doped by employing CVD is formed over the entire surface of the substrate SUB1 to have a thickness of 10 to 50 nm.

Then, the n(+)-type semiconductor layer is patterned by employing the photolithography technology and is further etched, and accordingly, is left on a top surface of the semiconductor layer AS' of the n-type thin film transistor TFT (nD) and a top surface of the semiconductor layer AS' of the n-type thin film transistor TFT (nP). The n(+)-type semiconductor layer thus left is used as the contact layer DO of the n-type thin film transistor TFT (nD) and the contact layer DO of the n-type thin film transistor TFT (nP). The n(+)-type semiconductor layer is also etched in portions which become a channel region of the n-type thin film transistor TFT (nD) and a channel region of the n-type thin film transistor TFT (nP).

Process 6. (FIG. 7(f))

A film made of aluminum (Al) is formed over the entire surface of the substrate SUB1 by employing sputtering to have a film thickness of 300 to 500 nm.

On this occasion, on upper and lower surfaces of the Al layer, a film made of refractory metal such as titanium (Ti) or molybdenum (Mo) is formed to have a film thickness of 30 to 100 nm. The refractory metal film is referred to as a so-called barrier metal layer, and is formed to reduce a contact resistance.

After that, the Al layer is patterned by employing the photolithography technology and is selectively etched, with the result that the drain electrode DT' and the source electrode ST' are formed in the formation region of the n-type thin film transistor TFT (nD), the drain electrode DT and the source electrode ST are formed in the formation region of the p-type thin film transistor TFT (pD), and the drain electrode DT" and the source electrode ST" are formed in the formation region of the n-type thin film transistor TFT (nP).

Further, a protective film (not shown) made of an SiN film or the like is formed over the entire surface of the substrate SUB1 by employing CVD so as to cover the n-type thin film transistor TFT (nD), the p-type thin film transistor TFT (pD), and the n-type thin film transistor TFT (nP).

Then, annealing is performed for one to three hours at a temperature of 350 to 450° C. in $H_2$ or $N_2$ atmosphere. Through the annealing thus performed, aluminum (Al) contained in the drain electrode DT and the source electrode ST of the p-type thin film transistor TFT (pD) is diffused (is diffused through the barrier metal layer) into the semiconductor layer SC (corresponding to the semiconductor layer AS' and the semiconductor layer PS of FIG. 7(f)). As a result, a p(+)-type diffusion layer DF is formed at an interface between the drain electrode DT and the semiconductor layer SC and an interface between the source electrode ST and the semiconductor layer SC. It should be noted that the annealing may be performed prior to the formation of the protective film.

The respective embodiments described above may be used independently or in combination. This is because the effects of the respective embodiments may be achieved independently or synergistically.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device, comprising a p-type thin film transistor and an n-type thin film transistor which are formed on a substrate, wherein:
    the p-type thin film transistor and the n-type thin film transistor each comprising:
        a gate electrode;
        a drain electrode;
        a source electrode;
        an insulating film; and
        a semiconductor layer formed on a top surface of the gate electrode through the insulating film,
    the drain electrode and the source electrode being formed so as to be opposed to each other with a clearance formed therebetween on a top surface of the semiconductor layer;
    the semiconductor layer of the p-type thin film transistor has, at each of an interface with the drain electrode and an interface with the source electrode, diffusion layers of p-type impurities formed therein; and
    the n-type thin film transistor further includes, at each of an interface between the drain electrode, which is formed in the same layer and is made of the same material as the drain electrode and the source electrode of the p-type thin film transistor, and the semiconductor layer and an interface between the source electrode, which is formed in the same layer and is made of the same material as the drain electrode and the source electrode of the p-type thin film transistor, and the semiconductor layer, semiconductor layers in which n-type impurities are doped.

2. The display device according to claim 1, wherein the n-type thin film transistor further includes, at each of the interface between the drain electrode and the semiconductor layer and the interface between the source electrode and the semiconductor layer, diffusion barrier layers for preventing a material of the drain electrode and the source electrode from diffusing into the semiconductor layer, and wherein the semiconductor layers in which n-type impurities are doped and the diffusion barrier layers are respectively accumulated as a sequentially-laminated body.

3. The display device according to claim 1, wherein the drain electrode and the source electrode are formed of, as a main material, any one material selected from the group consisting of aluminum, gallium, indium, and thallium, and the any one material is diffused into the semiconductor layer to form the diffusion layer of p-type impurities.

4. The display device according to claim 1, wherein the semiconductor layer is formed of a polycrystalline semiconductor layer.

5. The display device according to claim 1, wherein the semiconductor layer is formed of a sequentially-laminated body of a polycrystalline semiconductor layer and an amorphous semiconductor layer.

6. The display device according to claim 2, wherein the drain electrode and the source electrode are formed of, as a main material, any one material selected from the group consisting of aluminum, gallium, indium, and thallium, and the any one material is diffused into the semiconductor layer to form the diffusion layer of p-type impurities.

7. The display device according to claim 2, wherein the semiconductor layer is formed of a polycrystalline semiconductor layer.

8. The display device according to claim 2, wherein the semiconductor layer is formed of a sequentially-laminated body of a polycrystalline semiconductor layer and an amorphous semiconductor layer.

* * * * *